June 29, 1965 YOHAN CHO 3,192,408

PULSE-GENERATOR PROVIDING OUTPUT-PULSE WIDTH DETERMINED BY PAIR OF PRESELECTED VOLTAGE LEVELS OF RAMP FUNCTION SIGNAL

Filed Nov. 27, 1962

INVENTOR.
YOHAN CHO

BY [signature]

ATTORNEY 3,192,408

PULSE-GENERATOR PROVIDING OUTPUT-PULSE WIDTH DETERMINED BY PAIR OF PRESELECTED VOLTAGE LEVELS OF RAMP FUNCTION SIGNAL

Yohan Cho, Norwood, Mass., assignor to Honeywell Inc., a corporation of Delaware Filed Nov. 27, 1962, Ser. No. 240,330
9 Claims. (Cl. 307—88.5)

Figure 1:
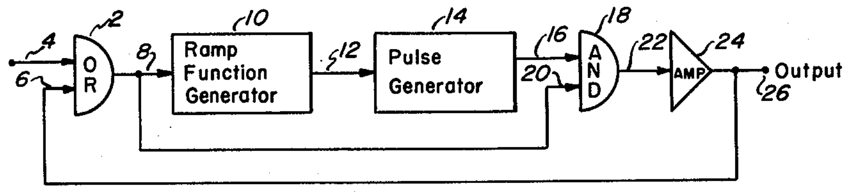

The present invention relates in general to transistor switching circuits and in particular to improved pulse forming apparatus capable of providing pulses having an accurately controlled duration and delay.

In the past, pulse forming circuits have generally relied upon the non-linear charging rates of reactive networks as a means for determining the delay and duration of an output pulse. Such circuits, however, have proven to be inadequate, particularly in instances where narrow pulse width signals are required, or where the delay of a pulse is to be varied without effecting its duration. Even minor variations in the values of the reactive components or the non-linear charging currents therethrough, give rise to significant changes in the output pulse parameters. With such circuits, the pulse delay and pulse width controls are often interdependent, whereby a change in the delay of a pulse affects its duration. In addition, the pulse parameters are non-linear with respect to applied control voltages.

It is therefore an object of the present invention to provide a pulse forming circuit whereby the pulse width and pulse delay can be accurately predicted.

It is another object of the present invention to provide a pulse forming circuit whereby changes in the pulse delay do not affect the pulse duration.

It is yet another object of the present invention to provide pulse forming apparatus whereby the pulse parameters are linearly related to their respective control voltage settings.

In the present invention, a linearly changing voltage, or voltage ramp is generated by the charging of a condenser from a constant current source. This ramp voltage signal is applied to a pair of voltage comparator stages and compared to preset reference voltage levels. When the ramp voltage level exceeds the reference voltage level applied to one of the comparator stages, the switching of the latter forms the leading edge of an output pulse. When the ramp voltage level subsequently exceeds the reference voltage level applied to the other one of the comparator stages, the switching of the latter forms the trailing edge of the aforementioned pulse.

It is therefore a further object of the present invention to provide pulse forming apparatus which employs a pair of voltage comparator stages which are consecutively switched upon the application of a voltage ramp input signal.

In instances where it is desired to provide a pulse having a fixed duration, which duration is not affected by changes in the delay of the pulse with respect to a circuit energizing signal, the difference between the reference voltage levels applied to the comparator stages is maintained constant. When the resetting of the ramp function generator produces an undesired second output pulse, gating structure is included which inhibits the transfer of this undesired pulse to an output terminal. Should the pulse forming circuit be energized by a signal which is not sustained for the duration of the normal ramp function interval, a regenerative feedback path is included, together with appropriate gating structure, to maintain the pulse forming apparatus in operation until the trailing edge on the output pulse has been properly formed.

It is therefore another object of the present invention to provide pulse forming apparatus which is activated by an energizing signal of short duration and which prevents the formation of a second output pulse during its deenergizing period.

Figure 2:
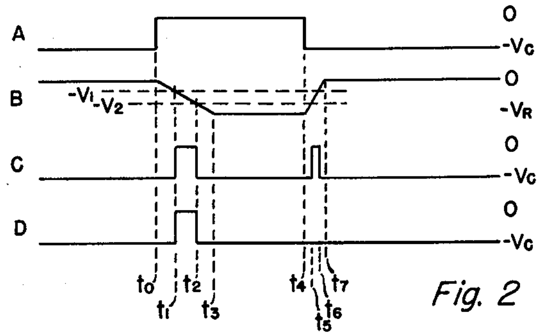
Figure 3:
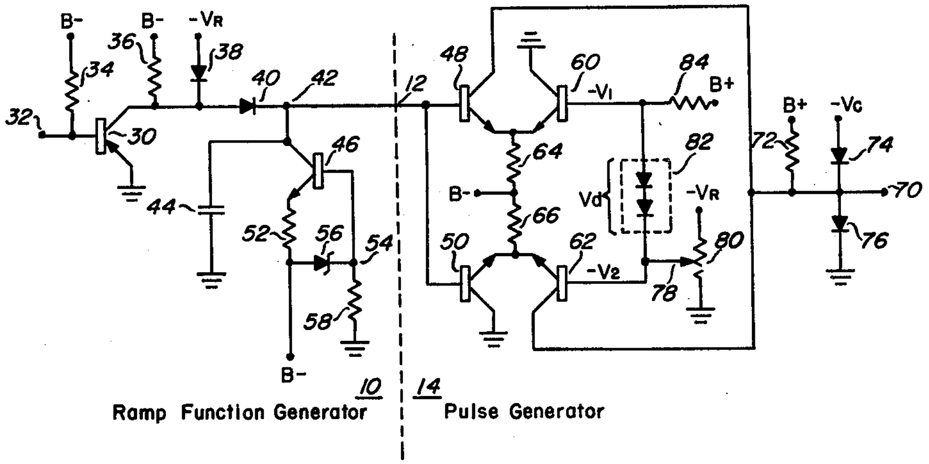

Other objects and features of the present invention will become apparent from the following detailed description when taken in conjunction with the drawing in which:

FIGURE 1 is a block diagram representation of a preferred embodiment of the present invention, FIGURE 2 illustrates waveforms observed at various portions of the pulse forming apparatus, and FIGURE 3 is a schematic diagram of the ramp function generator and pulse generator portions of the present invention.

As shown in the block diagram representation of FIGURE 1, the pulse forming apparatus comprises an OR gate 2 having a pair of gate input leads 4 and 6. The gate output lead 8 is coupled to a ramp function generator 10, the latter having its output lead 12 connected to the input of a pulse generator 14. The output lead of the pulse generator 14 and the gate output lead 8 are connected to the gate input leads 16 and 20 respectively of an AND gate 18. The AND gate output lead 22 is connected to the input of an amplifier 24, the latter having its output lead coupled to an output terminal 26 and to the input lead 6 of the OR gate 2.

The operation of the pulse forming apparatus illustrated in FIGURE 1 is best described with reference to the representative waveforms shown in FIGURE 2. FIGURE 2A, for example, shows a positive-going signal which is initiated at the time $t_0$ and which terminates at the time $t_4$. Such a signal is coupled to the gate input lead 4 and is effective to energize the ramp function generator 10. The output signal from the latter is illustrated by the waveform of FIGURE 2B, where a negative-going signal is initiated at the time $t_0$ and decreases uniformly from ground potential to a negative voltage level $-V_R$ during the time interval $t_0$ to $t_3$. This negative voltage ramp is thereafter applied to the input of the pulse generator 14 which forms the leading edge of a positive-going pulse when the voltage ramp exceeds the reference voltage level $-V_1$ at the time $t_1$. The trailing edge of the aforementioned pulse is formed when the voltage ramp subsequently exceeds the second voltage reference level $-V_2$ at the time $t_2$. The resultant pulse on the lead 16 is illustrated between the times $t_1$ and $t_2$ in FIGURE 2C. The pulse generator output signal is thereafter applied to the AND gate input lead 16, while the output signal from the OR gate 2 is coupled to the AND gate input lead 20. Since both of the aforementioned gate input signals are positive during the time interval $t_1$ to $t_2$, the gate 18 will be activated and will transfer the pulse on the lead 16 to the amplifier 22 and thence to the output terminal 26.

The output signal observed at the terminal 26 is also regeneratively applied to the gate input lead 6 of OR gate 2. Because of the aforementioned regenerative feedback path, a circuit energizing signal applied to the gate input lead 4 need only exist until an output signal from the pulse generator 14 has been initiated. The regenerative feedback signal applied to the gate input lead 6 thereafter maintains the ramp function generator in operation until the desired ending of the output pulse at the time $t_2$.

After the formation of the desired output pulse at the time $t_2$, the regenerative feedback signal to the gate input lead 6 is automatically terminated by the action of the AND gate 18. No further output response will be had from the pulse generator 14 until the termination of the circuit energizing pulse applied to the gate input lead 4. which in the operating conditions depicted in FIGURE 2A occurs at the time $t_4$. At this time, the ramp function generator is reset and the output signal therefrom goes positive towards ground potential at a finite rate as shown during the time interval $t_4$ to $t_7$ of FIGURE 2B. This positive-going signal resets the comparator stages within the pulse generator 14 and produces an undesired output pulse during the time interval $t_5$ to $t_6$ as illustrated in the waveform of FIGURE 2C. However, since there is no gate energizing signal applied to the AND gate input lead 20 at this time, the aforementioned undesired pulse is not coupled to the amplifier 24 or to the output terminal 26. Thus, only the desired output pulse of predetermined delay and duration is observed at the output terminal 26. This signal is illustrated in FIGURE 2D and has a delay time $t_1-t_0$, and duration $t_2-t_1$.

Preferred embodiments of the ramp function generator 10 and pulse generator 14 of FIGURE 1 are shown in detail in FIGURE 3. The ramp function generator 10, for instance, consists of a transistor switch 30 having its emitter connected to ground and its base connected to an input terminal 32 and to one end of a resistor 34, the latter having its other end connected to a negative biasing source B—. The collector of transistor 30 is connected to one end of a resistor 36, the cathode of a diode 38 and the anode of a diode 40. The other end of resistor 36 is connected to the aforementioned B— source, while the anode of the diode 38 is connected to a negative voltage source $-V_R$. The cathode of the diode 40 is connected to the ramp function generator output lead 12 and is also connected to one terminal of a condenser 44 and to the collector of a transistor 46 which, as will be shown, functions as a constant current source.

The other terminal of condenser 44 is connected to ground, while the emitter of the transistor 46 is coupled to the B— source by way of an emitter resistor 52. The base of transistor 46 is connected to a junction 54 which further connects the cathode of a Zener diode 56 and one end of a resistor 58, the latter having its other end connected to ground. The anode of the Zener diode 56 is connected to the B— source. The output lead 12 of the ramp function generator 10 is connected to the base of a transistor 48, which, together with a transistor 60, forms a first voltage comparator stage of the pulse generator 14. The base of transistor 48 is also connected to the base of a transistor 50 which, together with a transistor 62, forms a second voltage comparator stage of the pulse generator 14. The emitter of transistors 48 and 60 are each connected to one terminal of a common emitter resistor 64 which has its other terminal connected to the B— source. Similarly, the emitter of transistors 50 and 62 are connected to one terminal of a common emitter resistor 66 which has its other terminal connected to the aforementioned B— source. The collector of transistors 48 and 62 are each connected to a common output terminal 70 and to one end of a common collector resistor 72, the cathode of a diode 74 and the anode of a diode 76. The other end of resistor 72 is connected to a positive biasing source B+ while the anode of diode 74 is connected to a clamping voltage source $-V_C$. The cathode of diode 76 is connected to ground.

The collector element of transistors 60 and 50 are each connected to ground. The base of transistor 62 is connected to the slider 78 of a potentiometer 80 which has one end of its resistive element connected to the negative voltage source $-V_R$ and the other end of its resistive element connected to ground. The base of transistor 60 is connected to the free anode terminal of a diode combination 82 and also to one end of a resistor 84, the latter being further connected to the aforementioned B+ source. The free cathode terminal of the diode combination 82 is connected to the slider 78 of potentiometer 86.

In operation, the transistor switch 30 of the ramp function generator 10 is normally maintained in its fully conductive or saturated state by means of the forward biasing potential applied across its base-emitter junction via the resistor 34 and the B— source. The collector voltage of transistor 30 therefore approaches ground potential. Transistor 46 functions as a constant current source whose collector-emitter current is substantially equal to the voltage drop across the Zener diode 56 divided by the value of the emitter resistor 52. The collector current for transistor 46 normally flows from ground through the emitter-collector junction of transistor 30 and through the forward biased decoupling diode 40. Disregarding any small voltage drop across the decoupling diode 40, the voltage on the output lead 12 of the ramp function generator is maintained at ground potential. There can be no charge across the condenser 44 at this time.

Upon application of a positive-going signal to the terminal 32, such as the signal which is initiated at the $t_0$ in FIGURE 2A, transistor 30 is cut-off and its collector element immediately assumes the negative voltage level $-V_R$. The decoupling diode 40 becomes reverse-biased and the collector current for the transistor 46 now flows from ground through the condenser 44 causing the latter to charge negatively towards B— potential.

The instantaneous voltage across a condenser is known to be dependent upon the integral of the instantaneous current therethrough. In most circuit configurations, the charging current for a condenser varies exponentially with time. An exponential voltage rise is therefore developed across the condenser. In the present invention, however, the charging current for the condenser 44 is maintained constant by the action of transistor 46 so that the voltage across the condenser increases uniformly with time to produce a voltage ramp signal. As shown in FIGURE 2B, the voltage waveform of the ramp function generator, which is also the voltage across the condenser 44, increases negatively at a constant rate, between the times $t_0$ and $t_3$. At the time $t_3$, the diode 40 becomes forward biased and limits the maximum negative voltage across the condenser 44 to the value $-V_R$.

The operation of the pulse generator 14 will first be considered during the rise of the negative ramp voltage signal between the times $t_0$ to $t_3$. Initially, the comparator transistors 48 and 50 are conducting while the comparator transistors 60 and 62 are cut-off. The aforementioned operating conditions exist since the ramp voltage level is initially positive with respect to the reference voltage levels $-V_1$ and $-V_2$. The emitter voltages across the emitter resistors 64 and 66 are sufficiently positive to assure a reverse bias condition across the base-emitter junctions of the transistor 60 and 62 respectively. The conduction of transistor 48 causes its collector lead, which is coupled to the output terminal 70, to be at the negative voltage level $-V_c$.

As the voltage ramp applied to the base of transistor 48 proceeds in a negative direction, it eventially exceeds the reference voltage $-V_1$ applied to the base of transistor 60. When this occurs, transistor 48 is cut-off and transistor 60 becomes conductive. The collector of transistor 48 goes positive to a level limited by the clamp diode 76, which is referenced to ground potential. The positive excursion of the collector of transistor 48 forms the leading edge of the pulse generator output signal at the terminal 70. This positive voltage step is illustrated in FIGURE 2C at the time $t_1$.

Subsequently the voltage ramp becomes more negative than the reference voltage $-V_2$ which is applied to the base of transistor 62, causing the latter to become conductive. Its collector goes negative to the voltage $-V_c$ and the trailing edge of the pulse generator output signal is formed at the output terminal 70. The negative going step voltage is shown at the time $t_2$ in FIGURE 2C.

In order to vary the delay of the pulse generator signal with respect to the start of the ramp voltage signal at the time $t_0$, it is only necessary to vary the reference voltage level $-V_1$. Ordinarily, such a delay change would cause a change in the pulse duration. In the present invention, however, a constant voltage differential is established between the reference voltages $-V_1$ and $-V_2$ by way of the forward voltage drop across the diode combination 82. Thus, a change in the reference voltage $-V_1$ by means of the potentiometer 80, produces an equivalent voltage change in the reference voltage $-V_2$. Since the ramp voltage which is applied to each of the comparator stages decreases uniformily with time, the switching of the second comparator stage will still occur at a fixed time after the switching of the first comparator stage and the pulse duration remains constant. Furthermore, because of the constant slope of the ramp voltage signal, the pulse delay is linearly related to changes in the reference voltage $-V_1$.

When the energizing signal is removed from the input terminal 32 of the ramp function generator 10, its output lead 12 returns to ground potential at a rate governed by the impedance in series with the discharge path of condenser 44. As previously mentioned, an undesired pulse may be formed by the pulse generator 14 during the resetting of the ramp function generator 10. This pulse is shown during the time interval $t_5$ to $t_6$ in FIGURE 2C. By use of the gating structure shown in FIGURE 1, however, this undesired pulse is not coupled to the output terminal 24.

Various modifications may be made in the reference voltage portion of the pulse generator 14. For example, a Zener diode or a battery may be substituted for the diode combination 82 to provide the fixed voltage differential between the comparator stages. If the pulse delay and duration are to be separately controlled, the reference voltages $-V_1$ and $-V_2$ can be derived from independently adjustable sources.

In summary, the pulse forming apparatus of the present invention provides a means for obtaining output pulses having a predetermined and accurately controlled delay with respect to an energizing signal and in addition, provides a means for varying the pulse delay without affecting the pulse duration. The pulse forming apparatus is not dependent upon the non-linear charging characteristics of reactive networks as was formerly the case, and provides output pulses whose parameters are linearly related to applied control voltages.

It will be apparent from the foregoing disclosure of the preferred embodiment of the invention that numerous modifications, changes and equivalents will now occur to those skilled in the art, all of which fall within the true spirit and scope contemplated by the preferred embodiment of the invention.

What is claimed is:

1. A pulse-forming circuit comprising an input signal terminal adapted to receive a step input signal, a ramp function generator, means connecting said input terminal to said ramp function generator so that the latter will be activated to produce a ramp function signal upon the application of a step input signal, a pulse generator connected to the output of said ramp function generator, said pulse generator being adapted to produce an output pulse of a predetermined duration during the time the output of said ramp function generator is active, gating means coupled between the output of said pulse generator and a signal output terminal, means connecting said input signal terminal to said gating means to activate said gating means to pass the output of said pulse generator only so long as the input step signal is present and means connecting said output terminal to said ramp function generator to sustain the activation of the latter when said gating means is activated.

2. A pulse-forming circuit comprising an input signal terminal adapted to receive a step input signal, a ramp function generator, means connecting said input terminal to said ramp function generator so that the latter will be activated to produce a ramp function signal upon the application of a step input signal, a pulse generator connected to the output of said ramp function generator, means for applying a pair of preselected voltage levels to said pulse generator, said pulse generator being adapted to produce an output pulse having leading and trailing edges determined by said ramp function signal when it reaches respective ones of said pair of preselected voltage levels, gating means coupled between the output of said pulse generator and a signal output terminal, and means connecting said input signal terminal to said gating means to activate said gating means to pass the output of said pulse generator only so long as the input step signal is present.

3. A pulse-forming circuit comprising an input signal terminal adapted to receive a step input signal, a ramp function generator, means connecting said input terminal to said ramp function generator so that the latter will be activated to produce a ramp function signal upon the application of a step input signal, a pulse generator connected to the output of said ramp function generator, means for applying a pair of preselected voltage levels to said pulse generator, said pulse generator being adapted to produce an output pulse having leading and trailing edges determined by said ramp function signal when it reaches respective ones of said pair of preselected voltage levels, and means connecting the output of said pulse generator to a signal output terminal.

4. A pulse generator comprising an input terminal adapted to receive a ramp voltage signal, first and second voltage comparator stages, each of said stages having a pair of voltage comparison terminals, means coupling one of said comparison terminals of said first and second stages to first and second reference voltage levels respectively, means for maintaining a constant voltage differential between said first and second reference voltage levels, means connecting the other comparison terminal of said stages to said input terminal so that said comparator stages will be successively switched during the application of a ramp voltage signal at said input terminal, an output terminal, means coupling an output from said first comparator stage to said output terminal in response to the switching thereof to form the leading edge of an output pulse, and means coupling an output signal from said second comparator stage to said output terminal in response to the switching thereof to form the trailing edge of said output pulse.

5. A pulse generator comprising an input terminal adapted to receive a ramp voltage signal, first and second voltage campartor stages each adapted to provide an output, each of said stages having a pair of voltage comparison terminals, means coupling one of said comparison terminals of said first and second stages to first and second reference voltage levels respectively, means coupling the other comparison terminal of said stages to said input terminal so that said comparator stages will be successively activated during the application of a ramp voltage signal, an output terminal, means coupling the output of said first comparator stage to said output terminal to form the leading edge of an output pulse, and means coupling the output of said second comparator stage to said output terminal to form the trailing edge of said output pulse.

6. A pulse generator comprising an input terminal adapted to receive a ramp voltage signal, first and second comparator stages, each of said stages having a pair of voltages comparison terminals, means coupling one of said comparison terminals of said first and second stages to first and second reference voltage levels respectively, means coupling the other comparison terminal of said stages to said input terminal whereby said comparator stages are successively activated during the application of a ramp voltage signal, an output terminal, means coupling a positive-going signal from said first comparator stage to said output terminal when said ramp signal exceeds said first reference voltage level, and means coupling a negative-going signal from said second comparator stage to said output terminal when said ramp voltage exceeds said second reference voltage level.

7. Apparatus as claimed in claim 6 and further including means for maintaining a fixed voltage differential between said first and second reference voltage levels.

8. A pulse-forming circuit comprising an input terminal, a pair of voltage comparator stages, one of said comparator stages including first and second transistors, the other of said comparator stages including third and fourth transistors, each of said transistors having a base, an emitter and a collector, means coupling the base of said first and third transistors to said input terminal, means coupling the base of said second and fourth transistors to first and second reference voltage levels respectively, means coupling the collector of said second and third transistors to a reference terminal, means for applying a biasing voltage to the emitters of said first and second transistors and of said third and fourth transistors respectively, an output terminal, impedance means connected between said output terminal and a biasing source, and means coupling the collectors of said first and fourth transistors to said output terminal.

9. A pulse-forming circuit comprising an input terminal, a pair of voltage comparator stages, one of said comparator stages including first and second transistors each having a base, an emitter and a collector, said first and second transistors having their emitters coupled to one end of a first emitter resistor, the other of said comparator stages including third and fourth transistors each having a base, an emitter and a collector, said third and fourth transistors having their emitters coupled to one end of a second emitter resistor, the other ends of said first and second emitter resistors being connected to a negative biasing source, means coupling the base of said first and third transistors to said input terminal, means coupling the base of said second and fourth transistors to first and second reference voltage levels respectively, means for maintaining a constant voltage differential between said first and second reference voltage levels, a ground terminal, means coupling the collector of said second and third transistors to said ground terminal, an output terminal, a common collector resistor connected between said output terminal and a positive biasing source, and means coupling the collector of said first and fourth transistors to said output terminal.

References Cited by the Examiner

UNITED STATES PATENTS 2,845,548 7/58 Sillman et al. ---------- 307—88.5

ARTHUR GAUSS, *Primary Examiner.*